(12) United States Patent
Chen et al.

(10) Patent No.: US 12,289,900 B2
(45) Date of Patent: Apr. 29, 2025

(54) HEMT AND METHOD OF FABRICATING THE SAME

(71) Applicant: UNITED MICROELECTRONICS CORP., Hsin-Chu (TW)

(72) Inventors: Chi-Hsiao Chen, Chiayi (TW); Kai-Lin Lee, Kinmen County (TW); Wei-Jen Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 243 days.

(21) Appl. No.: 17/335,049

(22) Filed: May 31, 2021

(65) Prior Publication Data

US 2022/0359740 A1 Nov. 10, 2022

(30) Foreign Application Priority Data

May 7, 2021 (CN) .......................... 202110493062.0

(51) Int. Cl.
*H10D 30/47* (2025.01)
*H10D 30/01* (2025.01)
*H10D 62/85* (2025.01)

(52) U.S. Cl.
CPC ......... *H10D 30/475* (2025.01); *H10D 30/015* (2025.01); *H10D 62/8503* (2025.01)

(58) Field of Classification Search
CPC ............. H01L 29/7786; H01L 29/2003; H01L 29/66462; H01L 29/36; H01L 29/7783
See application file for complete search history.

(56) References Cited

U.S. PATENT DOCUMENTS

| | | | |
|---|---|---|---|
| 7,160,748 B2 | 1/2007 | Ishibashi | |
| 8,404,508 B2 | 3/2013 | Lidow | |
| 8,796,738 B2 | 8/2014 | Briere | |
| 9,419,125 B1* | 8/2016 | Schultz | H01L 29/7786 |
| 9,608,075 B1 | 3/2017 | Wan | |
| 10,014,402 B1 | 7/2018 | Chen | |
| 10,985,271 B2 | 4/2021 | Yang | |
| 11,088,271 B2 | 8/2021 | Lee | |
| 11,121,230 B2* | 9/2021 | Chen | H01L 21/02579 |
| 11,227,944 B2 | 1/2022 | Hsieh | |
| 11,239,327 B2 | 2/2022 | Lee | |
| 11,264,492 B2 | 3/2022 | Huang | |
| 2020/0098871 A1* | 3/2020 | Chen | H01L 29/66462 |

OTHER PUBLICATIONS

Posthuma et al., "Impact of Mg out-diffusion and activation on the p-GaN gate HEMT device performance", Proceedings of the 2016 28th International Symposium on Power Semiconductor Devices and ICs (ISPSD), Jun. 12-16, 2016 (Year: 2016).*

* cited by examiner

*Primary Examiner* — Jay C Kim
*Assistant Examiner* — Woo K Lee
(74) *Attorney, Agent, or Firm* — Winston Hsu

(57) ABSTRACT

A high electron mobility transistor includes a substrate. A channel layer is disposed on the substrate. An active layer is disposed on the channel layer. The active layer includes a P-type aluminum gallium nitride layer. A P-type gallium nitride gate is disposed on the active layer. A source electrode and a drain electrode are disposed on the active layer.

5 Claims, 5 Drawing Sheets

HEMT AND METHOD OF FABRICATING THE SAME

BACKGROUND OF THE INVENTION

1. Field of the Invention

The present invention relates to a high electron mobility transistor (HEMT) which has P-type dopants in an active layer to increase a threshold voltage.

2. Description of the Prior Art

Due to their semiconductor characteristics, III-V semiconductor compounds may be applied in many kinds of integrated circuit devices, such as high power field effect transistors, high frequency transistors, or HEMTs. In the high electron mobility transistor, two semiconductor materials with different band-gaps are combined and a heterojunction is formed at the junction between the semiconductor materials as a channel for carriers. In recent years, gallium nitride (GaN) based materials have been applied in high power and high frequency products because of their properties of wider band-gap and high saturation velocity.

A two-dimensional electron gas (2DEG) may be generated by the piezoelectric property of the GaN-based materials, and the switching velocity may be enhanced because of the higher electron velocity and the higher electron density of the 2DEG.

A normally-off HEMT often uses a P-type gallium nitride gate to form a depletion region with in a channel layer to increase a threshold voltage. However, when a concentration of P-type dopants within the P-type gallium nitride gate is too high, current leakage occurs and flows from a gate electrode to the channel layer.

SUMMARY OF THE INVENTION

In light of above, a new structure of an HEMT is provided to solve the above-mentioned problem.

According to a preferred embodiment of the present invention, an HEMT includes a substrate. A channel layer is disposed on the substrate. An active layer is disposed on the channel layer, wherein the active layer includes a P-type aluminum gallium nitride layer. A P-type gallium nitride gate is disposed on the active layer and a source electrode and a drain electrode are disposed on the active layer.

According to another preferred embodiment of the present invention, a fabricating method of an HEMT includes providing a substrate. Later, a channel layer is formed to be disposed on the substrate. After that, an active layer is formed to be disposed on the channel layer, wherein the active layer includes a P-type aluminum gallium nitride layer. Next, a p-type gallium nitride gate is formed to be disposed on the active layer. Finally, a source electrode and a drain electrode are formed to be disposed on the active layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
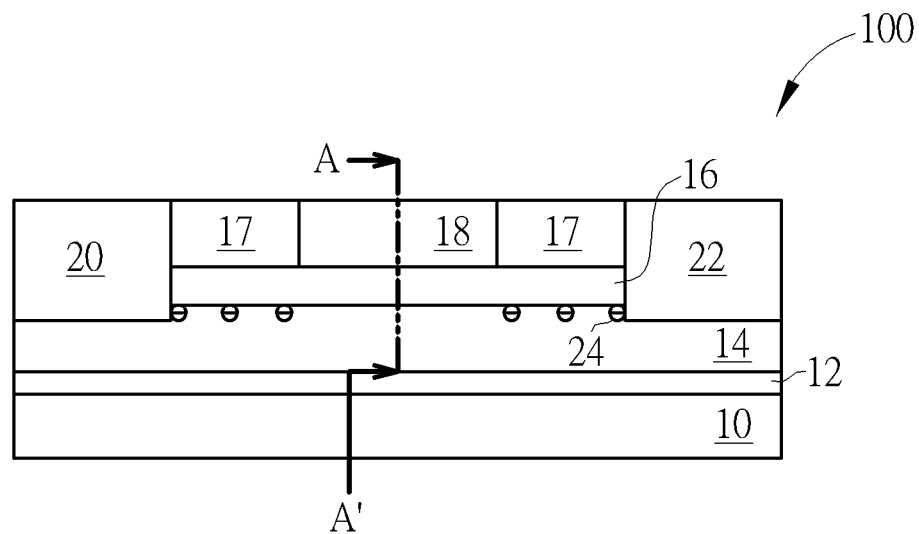
FIG. 1 depicts an HEMT according to a preferred embodiment of the present invention.

FIG. 1 depicts a high electron mobility transistor (HEMT) according to a preferred embodiment of the present invention.

As shown in FIG. 1, a normally-off HEMT 100 includes a substrate 10. A nucleation layer 12 is disposed on the substrate 10. A channel layer 14 is disposed on the nucleation layer 12. An active layer 16 is disposed on the channel layer 14 and contacts the channel layer 14. The active layer 16 is a P-type aluminum gallium nitride layer. The P-type aluminum gallium nitride layer refers to an aluminum gallium nitride layer with P-type dopants. The P-type dopants include C, Mg, Zn or Fe. In this embodiment, the P-type dopants are preferably Mg. A P-type gallium nitride gate 18 is disposed on the active layer 16. A protective layer 17 is disposed on the active layer 16 at two sides of the P-type gallium nitride gate 18. A source electrode 20 and a drain electrode 22 are disposed on the active layer 16. Two-dimensional electron gas (2DEG) 24 generates within the channel layer 14 which is not covered by the P-type gallium nitride gate 18. The channel layer 14 includes gallium nitride, aluminum nitride, indium nitride, aluminum gallium nitride, indium gallium nitride or aluminum indium nitride. In this preferred embodiment, the channel layer 14 is preferably gallium nitride.

Figure 2:
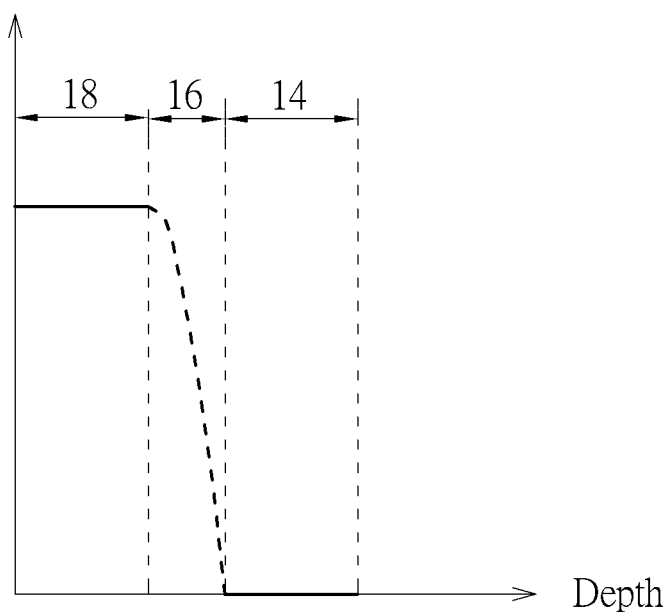
FIG. 2 depicts a concentration profile of P-type dopants within a P-type gallium nitride gate, an active layer and a channel layer taken along line AA' in FIG. 1 according to a preferred embodiment of the present invention.
Figure 3:
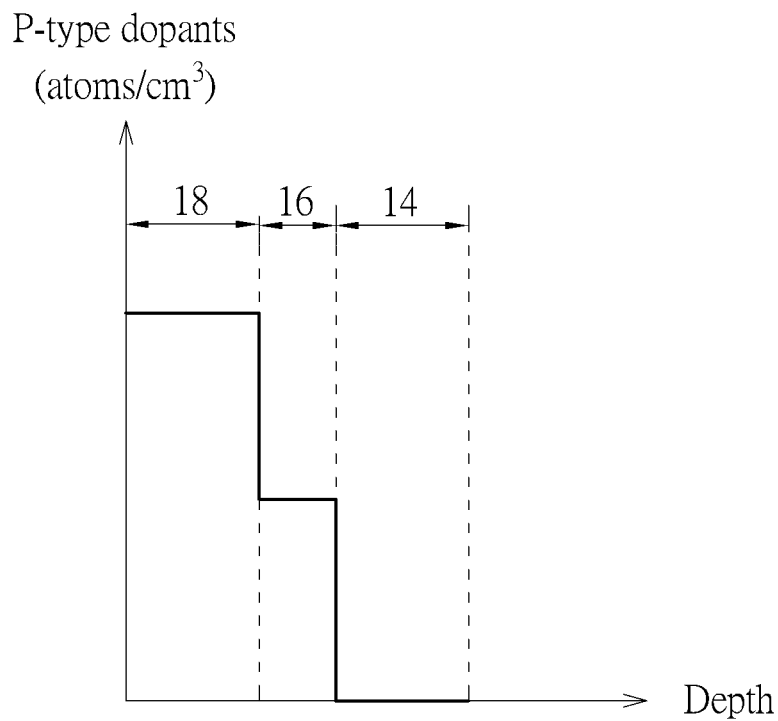
FIG. 3 depicts a concentration profile of P-type dopants within a P-type gallium nitride gate, an active layer and a channel layer taken along line AA' in FIG. 1 according to another preferred embodiment of the present invention.
Figure 4:
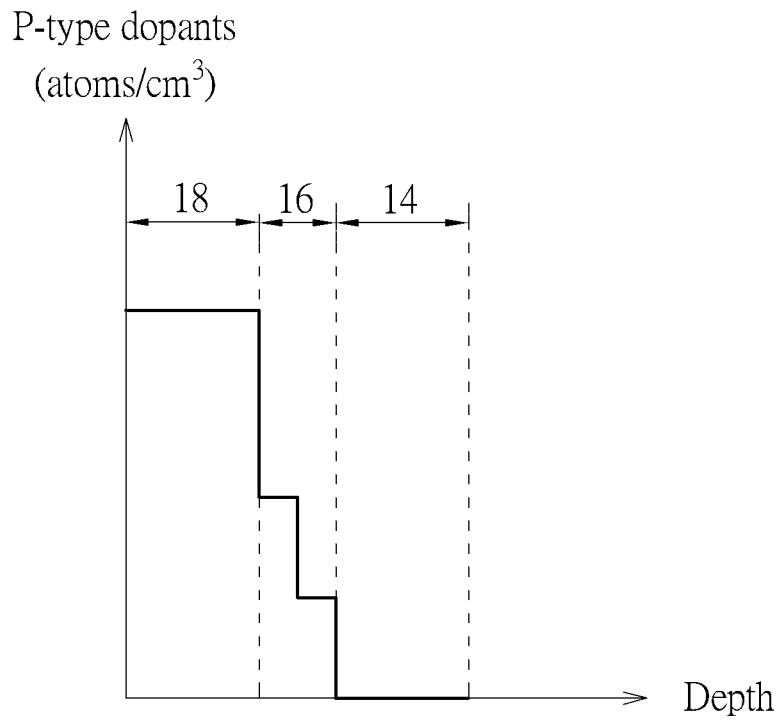
FIG. 4 depicts a concentration profile of P-type dopants within a P-type gallium nitride gate, an active layer and a channel layer taken along line AA' in FIG. 1 according to yet another preferred embodiment of the present invention.

FIG. 2 depicts a concentration profile of P-type dopants within a P-type gallium nitride gate, an active layer and a channel layer taken along line AA' in FIG. 1 according to a preferred embodiment of the present invention. FIG. 3 depicts a concentration profile of P-type dopants within a P-type gallium nitride gate, an active layer and a channel layer taken along line AA' in FIG. 1 according to another preferred embodiment of the present invention. FIG. 4 depicts a concentration profile of P-type dopants within a P-type gallium nitride gate, an active layer and a channel layer taken along line AA' in FIG. 1 according to yet another preferred embodiment of the present invention.

As shown in FIG. 1 and FIG. 2, a gradient concentration of P-type dopants within the P-type aluminum gallium nitride layer decreases toward the channel layer 14. That is, the concentration of P-type dopants within the P-type aluminum gallium nitride layer differs in different depths. The concentration of P-type dopants within the P-type gallium nitride gate 18 is higher than the concentration of P-type dopants within the active layer 16. Moreover, P-type dopants within the P-type gallium nitride gate 18 are the same element as those within the active layer 16 such as Mg. There are no P-type dopants within the channel layer 14. In other cases, there are small amount of P-type dopants diffused from the active layer 16. Furthermore, a concentration of P-type dopants within the active layer 16 is between 1E16 atoms/cm$^3$ and 1E19 atoms/cm$^3$. A concentration of P-type dopants within the active layer 16 is 5% to 20% of a concentration of P-type dopants within the P-type gallium nitride gate 18. According to a preferred embodiment of the present invention, a concentration of P-type dopants within the active layer 16 is 6% to 12% of a concentration of P-type dopants within the P-type gallium nitride gate 18.

As shown in FIG. 3, a concentration of P-type dopants within the active layer 16 decreases in a stair step profile toward the channel layer 14. In details, the concentration of P-type dopants within the active layer 16 is the same in all depths. Other element conditions such as the concentration of P-type dopants or types of P-type dopants are the same as those in the FIG. 2, and therefore descriptions are omitted here.

As shown in FIG. 4, a concentration of P-type dopants within the active layer 16 decreases in a stair step profile toward the channel layer 14. Depth in different ranges within the active layer 16 respectively corresponds to a concentration of P-type dopants in the active layer 16. In details, there are two ranges of depth in this embodiment, and these two ranges respectively correspond to a fixed concentration of P-type dopants. Other element conditions such as the concentration of P-type dopants or types of P-type dopants are the same as those in the FIG. 2, and therefore description are omitted here.

Figure 5:
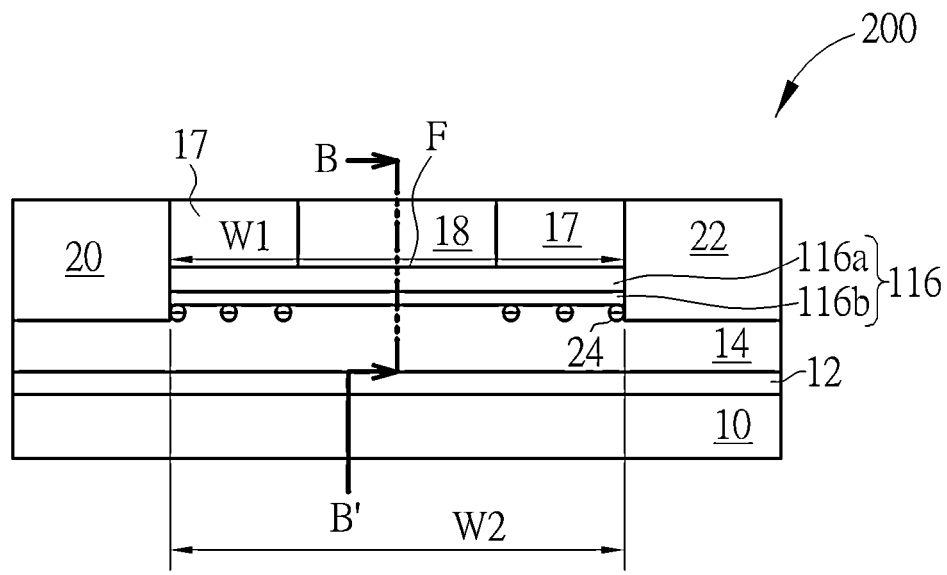
FIG. 5 depicts an HEMT according to a second preferred embodiment of the present invention.

FIG. 5 depicts an HEMT according to a second preferred embodiment of the present invention, wherein elements which are substantially the same as those in the first preferred embodiment are denoted by the same reference numerals; an accompanying explanation is therefore omitted. As shown in FIG. 5, the difference between the HEMT 200 and the HEMT 100 is that an active layer 116 of the HEMT 200 includes a P-type aluminum gallium nitride layer 116a and a undoped aluminum gallium nitride layer 116b. On the other hand, the active layer 16 in the first preferred embodiment only includes a P-type aluminum gallium nitride layer. Please still refer to FIG. 5. The undoped aluminum gallium nitride layer 116b is disposed between the P-type aluminum gallium nitride layer 116a and the channel layer 14. A width W2 of the undoped aluminum gallium nitride layer 116b is the same as a width W1 of the P-type aluminum gallium nitride layer 116a. Moreover, an interface F is between the P-type gallium nitride gate 18 and the P-type aluminum gallium nitride layer 116a, the interface F is a surface where the P-type gallium nitride gate 18 physically contacts the P-type aluminum gallium nitride layer 116a. A gradient concentration of P-type dopants within the P-type aluminum gallium nitride layer 116a decreases from the interface F toward the channel layer 14, and the gradient concentration of P-type dopants within the P-type aluminum gallium nitride layer 116a has a highest concentration at the interface F. Other elements are the same as those in the first preferred embodiment, and therefore description are omitted here.

Figure 6:
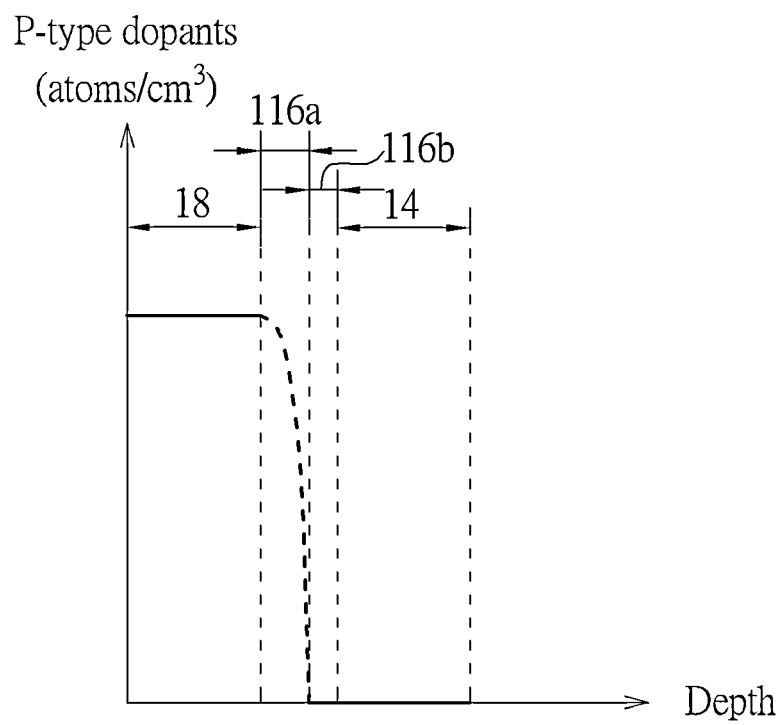
FIG. 6 depicts a concentration profile of P-type dopants within a P-type gallium nitride gate, an active layer and a channel layer taken along line BB' in FIG. 5 according to a preferred embodiment of the present invention.
Figure 7:
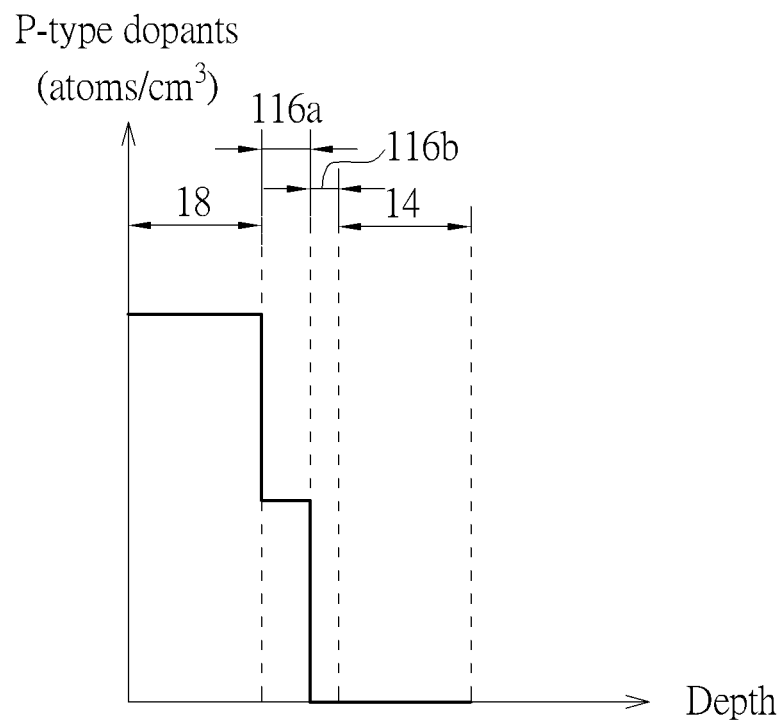
FIG. 7 depicts a concentration profile of P-type dopants within a P-type gallium nitride gate, an active layer and a channel layer taken along line BB' in FIG. 5 according to another preferred embodiment of the present invention.

FIG. 6 depicts a concentration profile of P-type dopants within a P-type gallium nitride gate, an active layer and a channel layer taken along line BB' in FIG. 5 according to a preferred embodiment of the present invention. FIG. 7 depicts a concentration profile of P-type dopants within a P-type gallium nitride gate, an active layer and a channel layer taken along line BB' in FIG. 5 according to another preferred embodiment of the present invention.

As shown in FIG. 6, a gradient concentration of P-type dopants within an entirety of the P-type aluminum gallium nitride layer 116a decreases continuously from the interface F toward the channel layer 14. That is, the concentration of P-type dopants within the P-type aluminum gallium nitride layer 116a differs in different depths. The concentration of P-type dopants within the P-type gallium nitride gate 18 is higher than the concentration of P-type dopants within the P-type aluminum gallium nitride layer 116a. Moreover, a concentration of the P-type dopants within the undoped aluminum gallium nitride layer 116b of the active layer 116 is 0. Moreover, P-type dopants within the P-type gallium nitride gate 18 are the same element as those within the P-type aluminum gallium nitride layer 116a such as Mg. There are no P-type dopants within the channel layer 14. Furthermore, a concentration of P-type dopants within the P-type aluminum gallium nitride layer 116a is between 1E16 atoms/cm$^3$ and 1E19 atoms/cm$^3$. A concentration of P-type dopants within the P-type aluminum gallium nitride layer 116a is 5% to 20% of a concentration of P-type dopants within the P-type gallium nitride gate 18. According to a preferred embodiment of the present invention, a concentration of P-type dopants within the P-type aluminum gallium nitride layer 116a is 6% to 12% of a concentration of P-type dopants within the P-type gallium nitride gate 18.

As shown in FIG. 7, a concentration of P-type dopants within the P-type aluminum gallium nitride layer 116a decreases in a stair step profile toward the channel layer 14. The concentration of P-type dopants within the P-type aluminum gallium nitride layer 116a is the same in all depths. A concentration of P-type dopants in the undoped aluminum gallium nitride layer 116b is 0. Other element conditions such as concentration of P-type dopants or types of P-type dopants in the P-type aluminum gallium nitride layer 116a are the same as those in the FIG. 6, and therefore description are omitted here.

Figure 8:
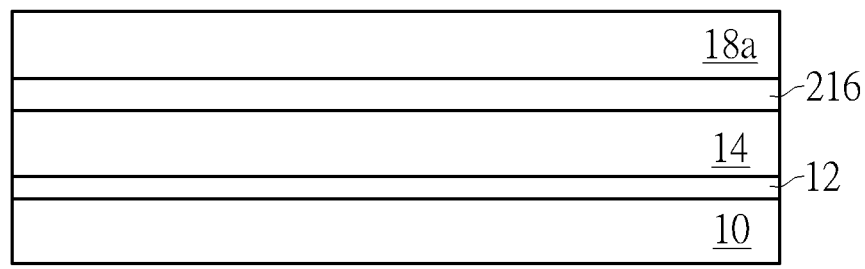
FIG. 8 depicts a fabricating method of an HEMT according to a preferred embodiment of the present invention.

FIG. 8 depicts a fabricating method of an HEMT according to a preferred embodiment of the present invention, wherein elements which are substantially the same as those in the first and second preferred embodiments are denoted by the same reference numerals; an accompanying explanation is therefore omitted.

As shown in FIG. 8, a fabricating method of an HEMT includes providing a substrate 10. Then, a nucleation layer 12 is formed to cover the substrate 10. Later, a channel layer 14 is formed on the substrate 10. After that, an undoped aluminum gallium nitride layer 216 is formed on the channel layer 14. Subsequently, a P-type gallium nitride layer 18a is formed to cover the undoped aluminum gallium nitride layer 216. Please refer to both FIG. 8 and FIG. 5. Some of P-type dopants within the P-type gallium nitride layer 18a are diffused into the undoped aluminum gallium nitride layer 216 to transform the undoped aluminum gallium nitride layer 216 into a P-type aluminum gallium nitride layer 116a while forming the P-type gallium nitride layer 18a. P-type dopants can be merely diffused into part of the region along the depth of the undoped aluminum gallium nitride layer 216. The region of the undoped aluminum gallium nitride layer 216 where P-type dopants not diffused into becomes an undoped aluminum gallium nitride layer 116b. In this way, a concentration profile shown in FIG. 6 can be achieved. Alternatively, as shown in FIG. 1 and FIG. 8, P-type dopants can be diffused into an entirety of the undoped aluminum gallium nitride layer 216 to transform all the undoped aluminum gallium nitride layer 216 to the P-type aluminum gallium nitride layer, i.e. the active layer 16 in FIG. 1. In this way, a concentration profile shown in FIG. 2 can be achieved. According to a preferred embodiment of the present invention, P-type dopants are diffused under a fabricating temperature greater than 600° C., and preferably greater than 1000° C. After that, as shown in FIG. 1 or FIG. 5, the P-type gallium nitride layer 18a is patterned to form a P-type gallium nitride gate 18. Later, a source electrode 20 and a drain electrode 22 are formed to be disposed on the active layer 16/active layer 116.

According to another preferred embodiment of the present invention, steps of diffusing P-type dopants can be performed after the P-type gallium nitride layer 18a is completed. After forming the P-type gallium nitride layer 18a, some P-type dopants within the P-type gallium nitride layer 18a are diffused into the undoped aluminum gallium nitride layer 216 to transform the undoped aluminum gallium nitride layer 216 into the P-type aluminum gallium nitride layer. Similarly, P-type dopants can be merely diffused into part of the region along the depth of the undoped aluminum gallium nitride layer 216. Alternatively, P-type dopants can be diffused into an entirety of the undoped aluminum gallium nitride layer 216. P-type dopants are diffused under a fabricating temperature greater than 600° C. After the P-type aluminum gallium nitride layer is formed, a P-type gallium nitride gate 18, a source electrode 20 and a drain electrode 22 are formed.

Figure 9:
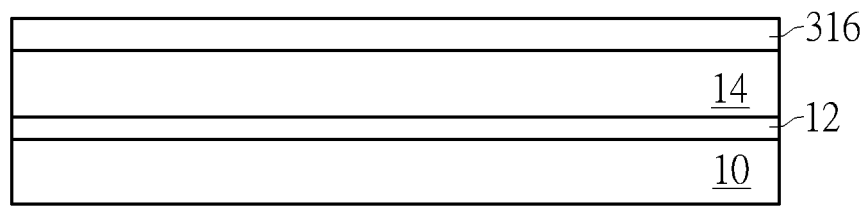
FIG. 9 depicts a fabricating method of an HEMT according to another preferred embodiment of the present invention.

FIG. 9 depicts a fabricating method of an HEMT according to another preferred embodiment of the present invention. The difference between FIG. 8 and FIG. 9 is that the P-type aluminum gallium nitride layer 316 is formed by a chemical vapor deposition process including providing P-type dopants and in-situ doping P-type dopants to form the P-type aluminum gallium nitride layer 316, rather than diffusing P-type dopants within the P-type gallium nitride layer. In other words, the P-type gallium nitride layer is formed after forming the P-type aluminum gallium nitride layer 316. In addition, an undoped aluminum gallium nitride layer (not shown) can be formed optionally before forming the P-type aluminum gallium nitride layer 316. By altering the timing to input P-type dopants and the flow rate of P-type dopants, a concentration profile of P-type dopants within the P-type aluminum gallium nitride layer 316 can be changed. For example, in the case of all of the P-type aluminum gallium nitride layer 316 containing P-type dopants, the P-type aluminum gallium nitride layer 316 can serve as the active layer 16 in FIG. 1. In the case that an undoped aluminum gallium nitride layer (not shown) is below the P-type aluminum gallium nitride layer 316, the P-type aluminum gallium nitride layer 316 and the undoped aluminum gallium nitride layer can respectively serve as the P-type aluminum gallium nitride layer 116a and the undoped aluminum gallium nitride layer 116b in FIG. 5. In other words, a concentration profile in FIG. 2, FIG. 3, FIG. 4, FIG. 6 and FIG. 7 can be reached by combining the P-type aluminum gallium nitride layer 316 with an optional undoped aluminum gallium nitride layer. In detail, by controlling flow rate of P-type dopants during the chemical vapor deposition process, the P-type aluminum gallium nitride layer 316 with an optional undoped aluminum gallium nitride layer can be formed. Later, as shown in FIG. 1 or FIG. 5, the P-type gallium nitride layer is patterned to form the P-type gallium nitride gate 18. Subsequently, a source electrode 20 and a drain electrode 22 are formed.

The present invention adds P-type dopants into the active layer of the HEMT. In this way, a threshold voltage of the HEMT can be increased. The depth of P-type dopants can be adjusted based on product requirements. The deeper P-type dopants are, i.e. the P-type dopants are closer to the channel layer, the higher threshold voltage of the HEMT becomes. However, when the depth of P-type dopants is deeper, the on-resistance of the HEMT is also raised. Therefore, the depth of P-type dopants can be adjusted to control the device function based on different product requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a substrate;
   a channel layer disposed on the substrate;
   an active layer disposed on the channel layer, wherein the active layer comprises a P-type aluminum gallium nitride layer;
   a P-type gallium nitride gate disposed on the active layer, wherein an interface is between the P-type gallium nitride gate and the P-type aluminum gallium nitride layer, the interface is a surface where the P-type gallium nitride gate physically contacts the P-type aluminum gallium nitride layer, a gradient concentration of P-type dopants within an entirety of the P-type aluminum gallium nitride layer decreases continuously from the interface toward the channel layer, and the gradient concentration of P-type dopants within the P-type aluminum gallium nitride layer has a highest concentration at the interface; and
   a source electrode and a drain electrode disposed on the active layer.

2. The HEMT of claim 1, wherein the active layer further comprises an undoped aluminum gallium nitride layer disposed between the P-type aluminum gallium nitride layer and the channel layer, and wherein the undoped aluminum gallium nitride layer contacts the channel layer.

3. The HEMT of claim 1, wherein the gradient concentration of P-type dopants within the P-type aluminum gallium nitride layer is between 1E16 atoms/cm$^3$ and 1E19 atoms/cm$^3$.

4. The HEMT of claim 1, wherein the gradient concentration of P-type dopants within the P-type aluminum gallium nitride layer is 6% to 12% of a concentration of P-type dopants within the P-type gallium nitride gate.

5. The HEMT of claim 1, wherein P-type dopants within the P-type aluminum gallium nitride layer comprises C, Mg, Zn or Fe.

* * * * *